US 6,721,029 B2

(12) United States Patent
Nishimura

(10) Patent No.: US 6,721,029 B2
(45) Date of Patent: Apr. 13, 2004

(54) ELECTRO-OPTICAL MATERIAL-BASED DISPLAY DEVICE

(75) Inventor: Ken A. Nishimura, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/379,373

(22) Filed: Aug. 23, 1999

(65) Prior Publication Data

US 2002/0054266 A1 May 9, 2002

(51) Int. Cl.[7] .................... G02F 1/1345; G02F 1/1333
(52) U.S. Cl. .................... 349/149; 349/139; 349/84
(58) Field of Search .................... 349/84, 139, 140, 349/153, 190, 155, 149, 189

(56) References Cited

U.S. PATENT DOCUMENTS

| | | | | | |
|---|---|---|---|---|---|
| 4,050,786 A | * | 9/1977 | Feldman | .................... | 350/160 |
| 5,054,890 A | * | 10/1991 | Hanyu et al. | .................... | 350/344 |
| 5,179,460 A | * | 1/1993 | Hinata et al. | .................... | 359/88 |
| 5,457,356 A | | 10/1995 | Parodos | .................... | 313/505 |
| 5,515,188 A | * | 5/1996 | Miles et al. | .................... | 359/62 |
| 5,969,783 A | * | 10/1999 | Takiar et al. | .................... | 349/150 |
| 6,122,033 A | * | 9/2000 | Mathew et al. | .................... | 349/155 |
| 6,172,878 B1 | * | 1/2001 | Takabayashi et al. | .................... | 361/760 |
| 6,399,178 B1 | * | 6/2002 | Chung | .................... | 428/131 |
| 6,406,988 B1 | * | 6/2002 | Chung | .................... | 438/612 |

FOREIGN PATENT DOCUMENTS

| | | | | |
|---|---|---|---|---|
| JP | 08062616 | 3/1996 | .................... | G02F/1/134 |
| JP | 11064874 | 3/1999 | .................... | G02F/1/134 |
| JP | 11084425 | 3/1999 | .................... | G02F/1/136 |

* cited by examiner

Primary Examiner—Tarifur R. Chowdhury
Assistant Examiner—Mike Qi

(57) ABSTRACT

A microdisplay is provided in which a display area, a bonding pad connected to the display area, and a contact pad operatively connected to the bonding pad are all located on a silicon die. An electrically conductive, coated glass is located over the display area and is electrically connected to the contact pad by a flexible conductive material. Under the coated glass is a material which responds to electricity to control the transmission or emission of light.

18 Claims, 1 Drawing Sheet

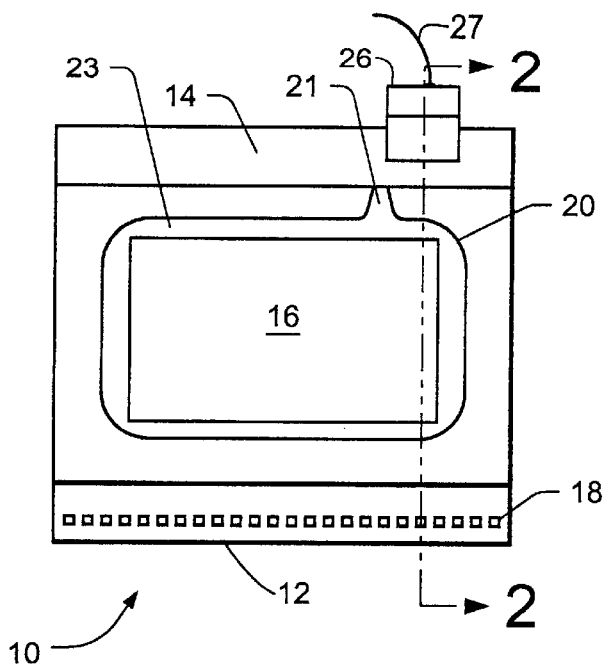
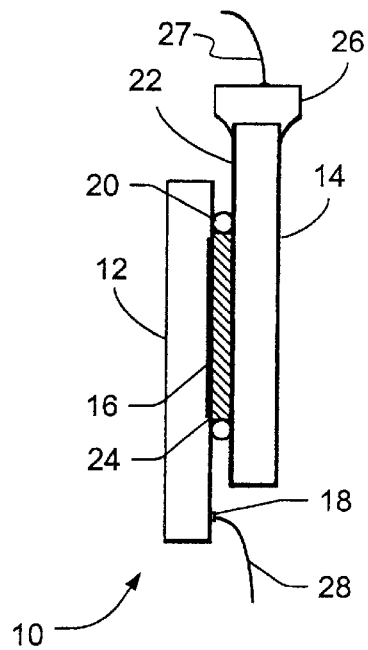
FIG. 1 (PRIOR ART)   FIG. 2 (PRIOR ART)
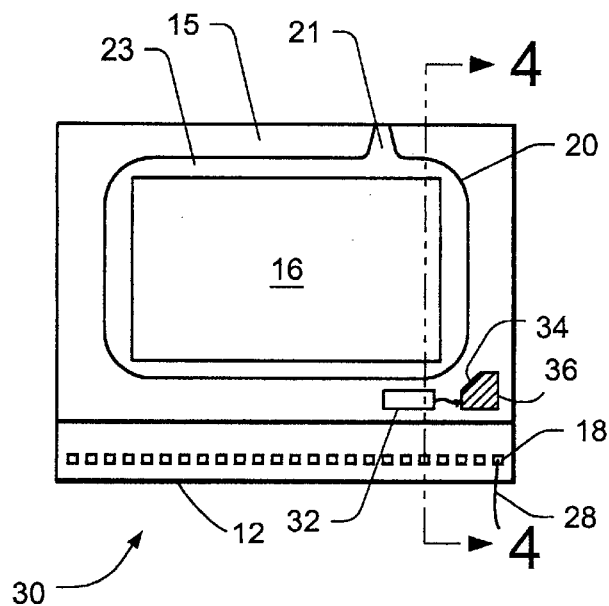
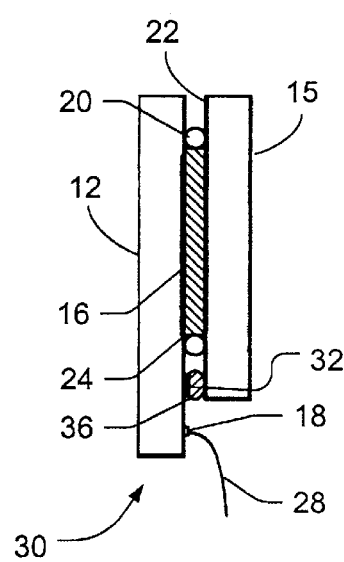
FIG. 3   FIG. 4

ELECTRO-OPTICAL MATERIAL-BASED DISPLAY DEVICE

CROSS-REFERENCE TO RELATED APPLICATIONS

The present application contains subject matter related to a copending U.S. patent application by Richard C. Walker, Travis N. Blalock, and Neela B. Gaddis entitled "ELECTRO-OPTICAL MATERIAL-BASED DISPLAY DEVICE HAVING ANALOG PIXEL DRIVERS" filed on Apr. 30, 1998, which is identified by Ser. No. 09/070,487, assigned to Hewlett-Packard Company, and hereby incorporated by reference.

The present application further contains subject matter related to a copending U.S. patent application by Travis N. Blalock, Neela B. Gaddis, and Richard C. Walker entitled "ANALOG PIXEL DRIVE CIRCUIT FOR AN ELECTRO-OPTICAL MATERIAL-BASED DISPLAY DEVICE", which is identified by Ser. No. 09/070,669, assigned to Hewlett-Packard Company, and hereby incorporated by reference.

TECHNICAL FIELD

The present invention relates generally to video and graphics display devices, and more particularly to microdisplays using liquid crystal materials on silicon.

BACKGROUND OF THE INVENTION

The technology of using liquid crystal materials in microdisplays is relatively new. The liquid crystal material, which forms the optical component of the microdisplay, is placed directly on top of a silicon integrated circuit, or pixel array, and the signals to turn the individual picture elements, or pixels, of the microdisplay on and off are generated on the silicon integrated circuit.

The term "microdisplay" is used since the display in a typical embodiment has an array of 1,024×768 pixels (the individual pixel size is approximately 12 $\mu$) and the silicon die is about 1.3 cm×1 cm in area.

The microdisplay works by having an illuminator, which converts non-polarized light from an ordinary light source into a polarized light beam onto the microdisplay. The microdisplay will reflect the light in a manner such that the plane of polarization of the light will or will not be rotated. The light then passes back to the illuminator which acts as an analyzer and causes the pixels to be bright or dark depending on whether the plane of polarization was rotated. Above the illuminator/analyzer are viewing optics which form the image.

Applications for these microdisplays continue to expand. In one application, they are used for viewfinders for digital cameras and camcorders. In another, two microdisplays are fixed to a frame, such as eyeglasses, thereby giving a user a virtual image of a virtual computer screen which is very lightweight and also very private.

Another application is in projection monitors for use in conference rooms. Since the microdisplay is reflective, high intensity light can be used to illuminate the microdisplay and, by using projection optics, an image of the microdisplay can be projected onto a large screen.

In the manufacturing process, the silicon die which contains the finished circuitry is sent through the following steps. An adhesive sealant ring, which will act to contain the liquid crystal material, is placed around the pixel array in a display area. Immediately after the ring is deposited, a conductively coated glass is placed on top of the ring thereby forming a chamber to hold the liquid crystal material. The coating on the glass is generally indium tin oxide (ITO) because it is highly conductive at thicknesses which render it transparent in the visible spectrum. The coating is on the surface of the glass in contact with the liquid crystal material and forms an electrically conductive, but transparent, common electrode. The common electrode forms the electrical cell which forms the image in conjunction with the display area and the liquid crystal material.

Following the adhesion of the coated glass on top of the silicon die by virtue of the adhesive sealant ring, the liquid crystal material is introduced into the space between the glass and the silicon die. Following this, a mechanical contact is made to the coated surface of the glass. The mechanical contact is necessary to provide the common electrode bias to the coated glass. The glass and the silicon die have to be physically offset so that a mechanical contact can be made to the coated surface of the glass by using a mechanical clip. This is a disadvantage in manufacturing because it makes it difficult to cleanly scribe and break off the silicon die from the silicon wafer on which the microdisplays are being manufactured in volume. Following the separation into an individual microdisplay device, the microdisplay is placed in a display-utilizing device and bonding wires are connected to the bonding pads from the display-utilizing device.

Even more recently, microdisplays have been made where light emitting diodes are deposited on top of the pixel array in place of the liquid crystal material. This emissive display also has the same problematic requirement for a transparent common electrode. Since these microdisplays are made in tremendous volumes, even slight cost reductions result in savings of significant sums of money. Thus, there is a continuous struggle to reduce costs and simplify manufacturing.

DISCLOSURE OF THE INVENTION

The present invention provides a microdisplay in which a display area, a bonding pad connected to the display area, and a contact pad operatively connected to the bonding pad are all located on a silicon die. An electrically conductive, coated glass is located over the display area and is electrically connected to the contact pad by a flexible conductive material. This approach eliminates a mechanical contact clip and allows the coated glass to be flush with the scribe and break line of the silicon die which was required with the prior art microdisplay. Under the coated glass is a material which responds to electricity to control the transmission or emission of light.

The present invention further provides a microdisplay that has the circuitry located on the silicon die necessary to generate the common electrode bias to drive the electrically coated glass portion of the microdisplay. Thus, the common electrode bias generator no longer needs to be on or in a separate component from the microdisplay. The contact between the common electrode bias generator and the electrical coating is made by a contact pad and a flexible electrical conductor. This promotes greater integration at the microdisplay.

The present invention further provides a microdisplay which eliminates the need for mechanical fasteners, and also the need to have a glass overhang which interferes with separation of the silicon die from the silicon wafer in which it is processed.

The above and additional advantages of the present invention will become apparent to those skilled in the art from a

BRIEF DESCRIPTION OF THE DRAWINGS

FIG. 1 (PRIOR ART) is a top view of a prior art microdisplay;

FIG. 2 (PRIOR ART) is a cross-sectional view of the microdisplay taken along the line 2—2 of FIG. 1 (PRIOR ART);

FIG. 3 is a top view of a microdisplay of the present invention; and

FIG. 4 is a cross-sectional view of the microdisplay taken along the line 4—4 of FIG. 3.

BEST MODE FOR CARRYING OUT THE INVENTION

Referring now to FIG. 1 (PRIOR ART) and FIG. 2 (PRIOR ART), therein is shown a microdisplay 10 manufactured on a silicon die 12. Disposed over the silicon die 12 is a transparent glass 14. A display area 16 made up of an array of pixels is disposed on the silicon die 12 and is electrically connected to bonding pads 18. The display area 16 is surrounded by an adhesive sealant, or ring 20, which has an opening 21.

Referring now to FIG. 2 (PRIOR ART), therein is shown a cross section of FIG. 1 (PRIOR ART) along the line 2—2. The glass 14 is coated with an electrically conductive coating 22, which may be indium tin oxide (ITO). In the space defined by the silicon die 12 and the glass 14 and bounded by the ring 20 to form a chamber 23 is a material which responds to the local electric field. One such electrically responsive material is a liquid crystal material 24. The liquid crystal material 24 is sealed into the chamber 23 by additional glue applied at the opening 21.

A contact clip 26 is shown on the overhanging edge of the glass 14 in electrical contact with the electrically conductive coating 22. The contact chip 26 is held on to the glass 14 by spring action and is connected by a wire 27 at the top to a common electrode bias generator (not shown) on or in a separate electrical component (not shown).

A bonding wire 28 connects the bonding pads 18 to a display-utilizing device (not shown) such as a digital camera, camcorder, virtual image device, projection monitor, etc.

Referring now to FIG. 3 and FIG. 4, therein is shown the microdisplay 30 of the present invention with the same elements as in FIG. 1 (PRIOR ART) and FIG. 2 (PRIOR ART) shown with the same numbers. The silicon die 12 has a transparent cover, such as glass 15. The display area 16 on the silicon die 12 is also accompanied by a common electrode bias generator 32, which is electrically connected to a contact pad 34 on the silicon die 12. When the ring 20 is deposited on the silicon die 12, a flexible conductive material 36 is also deposited. The flexible conductive material 36 can be a bead of conductive adhesive, elastomer, grease, etc. which will match the thickness of the ring 20 and provide a flexible, positive electrical contact between the silicon die 12 and the electrically conductive coating 22 on the glass 15.

In the past, a silicon wafer (not shown) was processed using conventional semiconductor wafer processing technology to form a plurality of display arrays, such as the display area 16. During the semiconductor manufacturing process, the display area 16 was connected to a plurality of bonding pads 18. While a part of the silicon wafer, the ring 20 was placed on the silicon die 12 around the display area 16 with an opening 21 at one side. The glass 14 with the electrically conductive coating 22 facing the display area 16 was placed over the ring 20 and bonded to the semiconductor wafer. The electrically conductive coating 22 is generally of indium tin oxide (ITO) because this material is both a good conductor and can be deposited in a thickness which is optically transparent.

After bonding the glass 14 to the semiconductor wafer, the semiconductor wafer was scribed and broken to form the silicon die 12 with each silicon die 12 holding one display area 16.

The chamber 23 above the display area 16 was then filled with the liquid crystal material 24 through the opening 21, and the opening 21 was then sealed by additional glue.

Since the common electrode generator (not shown) is on or in a separate electrical component from the microdisplay 10, it is necessary to use the contact clip 26 to provide an electrical connection to the electrically conductive coating 22. In order to place this contact clip 26 on the glass 14, it was necessary that the glass 14 overhang the silicon die 12; i.e., only the sides of the glass 14 are flush with the sides of the silicon die 12. It was this overhang which made scribing and breaking the silicon die 12 from the silicon wafer so difficult that many of the silicon die 12 broke in the wrong places and had to be rejected.

When the microdisplay 10 was placed in a digital camera or camcorder, bonding wires 28 were affixed to the bonding pads 18 to provide signals for the display area 16.

It should be noted that making a durable and reliable mechanical contact to the glass 14 is extremely difficult because the glass 14 is extremely thin and small for a microdisplay 10 which is approximately 1.3 cm×1 cm. Because it is difficult to make good mechanical contact to glass, the clip 26 added considerably to the expense of the final assembly of the end product.

In the present invention, the semiconductor wafer manufacturing process is modified slightly to add the additional contact pad 34. The additional contact pad 34 may be formed in the same step in which the bonding pads 18 are deposited. At that time, the contact pad 34 could be operatively connected to one of the bonding pads 18 so that the prior art common electrode generator can continue to be used. This would make the microdisplay 30 a drop-in replacement for the microdisplay 10.

In the best mode, it has been determined that the voltage or signal, which is necessary to place the electrically conductive coating 22 in an operative condition, is a constant bias voltage. This does not require complicated circuitry and is performed by a resistive divider using the voltages which drive the display area 16. At the same time, when a time-varying but deterministic bias is desired, this could also be provided with significant cost savings by somewhat more complex integrated circuitry. Thus, during the wafer-level semiconductor manufacturing process, the common electrode bias generator 32 is formed on and/or in the silicon die 12 and is connected to one of the bonding pads 18 and to the contact pad 34. This means that the common electrode bias generator no longer needs to be on a separate chip from the microdisplay.

After the wafer-level semiconductor manufacturing process is complete, the flexible conductive material 36 is placed on the contact pad 34, and the ring 20 is deposited on the silicon die 12. The glass 15 is then placed with the electrically conductive coating 22 in contact with the flexible conductive material 36. This approach eliminates the mechanical contact clip 26 and allows the glass 15 to be flush with the scribe and break line of the silicon die 12.

The subsequent steps for manufacturing include: the glass 15 being bonded; the chamber 23 being filled with the liquid crystal material 24; and the ring 20 being closed off with additional glue. The silicon die 12 and the glass 15 are scribed with lines for preferential breaking in a dicing process. In the present invention, the lines are positioned so the sides and at least one edge of the glass 15 will be flush with the sides and at least one edge of the silicon die 12 after dicing as shown in FIG. 4. The microdisplay 30 is then ready for the bonding wires 28 to be bonded for placement in the desired application.

While the present invention has been described in conjunction with a specific best mode, it is to be understood that many alternatives, modifications, and variations will be apparent to those skilled in the art in light of the aforegoing description. For example, rather than a liquid crystal display material, other electrically responsive materials could be substituted, such as light emissive material. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A display device based on an electro-optical material, comprising:
   a semiconductor substrate including an electrical display area, a first bonding pad connected to said electrical display area, a second bonding pad, and a contact pad operatively connected to said second bonding pad;
   a transparent cover having an electrically conductive coating disposed thereon;
   an electrically responsive material disposed between said semiconductor substrate and said transparent cover over said electrical display area; and
   a flexible conductive material disposed between said contact pad and said transparent cover in conductive contact with said electrically conductive coating.

2. The display device as claimed in claim 1 including:
   an adhesive disposed between said semiconductor substrate and said transparent cover enclosing said electrically responsive material.

3. The display device as claimed in claim 1 wherein:
   said conductive material is adhesive.

4. The display device as claimed in claim 1 wherein:
   said transparent cover has sides and at least one edge flush with the sides and at least one edge of said semiconductor substrate.

5. The display device as claimed in claim 1 including:
   circuitry disposed in said operative connection between said contact pad and said bonding pad.

6. The display device as claimed in claim 5 wherein:
   said circuitry changes voltage from said bonding pad to said contact pad.

7. The display device as claimed in claim 1 including:
   a display-utilizing device; and
   conductors connecting said bonding pad to said display-utilizing device.

8. The display device as claimed in claim 1 wherein:
   said electrically responsive material is a liquid crystal material.

9. The display device as claimed in claim 1 wherein:
   said electrically responsive material includes material for a light emitting diode.

10. A display device based on an electro-optical material, comprising:
    a silicon die including an electrical display area, a first bonding pad connected to said electrical display area, a second bonding pad, and a contact pad disposed thereon operatively connected to said second bonding pad;
    a glass cover having a transparent electrically conductive coating disposed thereon;
    an electrical responsive material disposed between said silicon die and said glass cover over said electrical display area; and
    a flexible conductive material disposed between said contact pad and said glass cover in conductive contact with said transparent electrically conductive coating.

11. The display device as claimed in claim 10 including:
    an adhesive sealant ring disposed between said semiconductor substrate and said transparent cover enclosing said electrically responsive material.

12. The display device as claimed in claim 10 wherein:
    said conductive material is an adhesive.

13. The display device as claimed in claim 10 wherein:
    said transparent cover has sides and at least one edge flush with the sides and at least one edge of said semiconductor substrate.

14. The display device as claimed in claim 10 including:
    circuitry disposed in said operative connection between said contact pad and said bonding pad.

15. The display device as claimed in claim 14 wherein:
    said circuitry includes a common electrode bias generator to change voltage from said bonding pad to said contact pad to apply an electrical bias voltage to said transparent electrically conductive coating.

16. The display device as claimed in claim 10 including:
    a display-utilizing device; and
    bonding wires connecting said bonding pad to said display-utilizing device.

17. The display device as claimed in claim 10 wherein:
    said electrically responsive material is a liquid crystal material.

18. The display device as claimed in claim 10 wherein:
    said electrically responsive material includes material for a light emitting diode.

* * * * *